(12) United States Patent
Yang et al.

(10) Patent No.: US 12,243,912 B2
(45) Date of Patent: Mar. 4, 2025

(54) SOURCE/DRAIN FEATURE FOR MULTIGATE DEVICE PERFORMANCE AND METHOD OF FABRICATING THEREOF

(71) Applicant: Taiwan Semiconductor Manufacturing Company, Ltd., Hsin-Chu (TW)

(72) Inventors: Chih-Chuan Yang, Hsinchu (TW); Wen-Chun Keng, Hsinchu County (TW); Chong-De Lien, Hsinchu (TW); Shih-Hao Lin, Hsinchu (TW); Hsin-Wen Su, Hsinchu (TW); Ping-Wei Wang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 479 days.

(21) Appl. No.: 17/552,111

(22) Filed: Dec. 15, 2021

(65) Prior Publication Data

US 2022/0367620 A1 Nov. 17, 2022

Related U.S. Application Data

(60) Provisional application No. 63/188,526, filed on May 14, 2021.

(51) Int. Cl.
| | |
|---|---|
| *H01L 29/06* | (2006.01) |
| *H01L 21/02* | (2006.01) |
| *H01L 21/764* | (2006.01) |
| *H01L 29/423* | (2006.01) |

(Continued)

(52) U.S. Cl.
CPC ...... *H01L 29/0653* (2013.01); *H01L 21/0259* (2013.01); *H01L 21/764* (2013.01); *H01L 29/0665* (2013.01); *H01L 29/42392* (2013.01); *H01L 29/6653* (2013.01); *H01L 29/66545* (2013.01); *H01L 29/66553* (2013.01);
(Continued)

(58) Field of Classification Search
CPC ........... H01L 29/42392; H01L 29/0653; H01L 29/66545; H01L 29/78618; H01L 29/78696; H01L 29/0673; H01L 29/66439; H01L 29/775; H01L 29/0847; H01L 29/41766; H01L 29/165; H01L 29/7848; B82Y 10/00
See application file for complete search history.

(56) References Cited

U.S. PATENT DOCUMENTS

2019/0103317 A1* 4/2019 Yu ........................ H01L 29/0673
2020/0365692 A1* 11/2020 Jung .................... H01L 29/0673

* cited by examiner

*Primary Examiner* — Moazzam Hossain
(74) *Attorney, Agent, or Firm* — HAYNES AND BOONE, LLP

(57) ABSTRACT

Semiconductor devices having improved source/drain features and methods for fabricating such are disclosed herein. An exemplary device includes a semiconductor layer stack disposed over a mesa structure of a substrate. The device further includes a metal gate disposed over the semiconductor layer stack and an inner spacer disposed on the mesa structure of the substrate. The device further includes a first epitaxial source/drain feature and a second epitaxial source/drain feature where the semiconductor layer stack is disposed between the first epitaxial source/drain feature and the second epitaxial source/drain feature. The device further includes a void disposed between the inner spacer and the first epitaxial source/drain feature.

20 Claims, 8 Drawing Sheets

(51) Int. Cl.
*H01L 29/66* (2006.01)
*H01L 29/786* (2006.01)
(52) U.S. Cl.
CPC .. *H01L 29/66742* (2013.01); *H01L 29/78618* (2013.01); *H01L 29/78696* (2013.01)

SOURCE/DRAIN FEATURE FOR MULTIGATE DEVICE PERFORMANCE AND METHOD OF FABRICATING THEREOF

The present application is a non-provisional application of and claims benefit of U.S. Patent Application Ser. No. 63/188,526, filed May 14, 2021, the entire disclosure of which is incorporated herein by reference.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

Recently, multigate devices have been introduced to improve gate control. Multigate devices have been observed to increase gate-channel coupling, reduce OFF-state current, and/or reduce short-channel effects (SCEs). One such multigate device is the gate-all around (GAA) device, which includes a gate structure that can extend, partially or fully, around a channel region to provide access to the channel region on at least two sides. GAA devices enable aggressive scaling down of IC technologies, maintaining gate control and mitigating SCEs, while seamlessly integrating with conventional IC manufacturing processes. As GAA devices continue to scale, challenges have arisen with the addition of multiple stacked channel layers, which challenges have been observed to degrade performance of the GAA devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
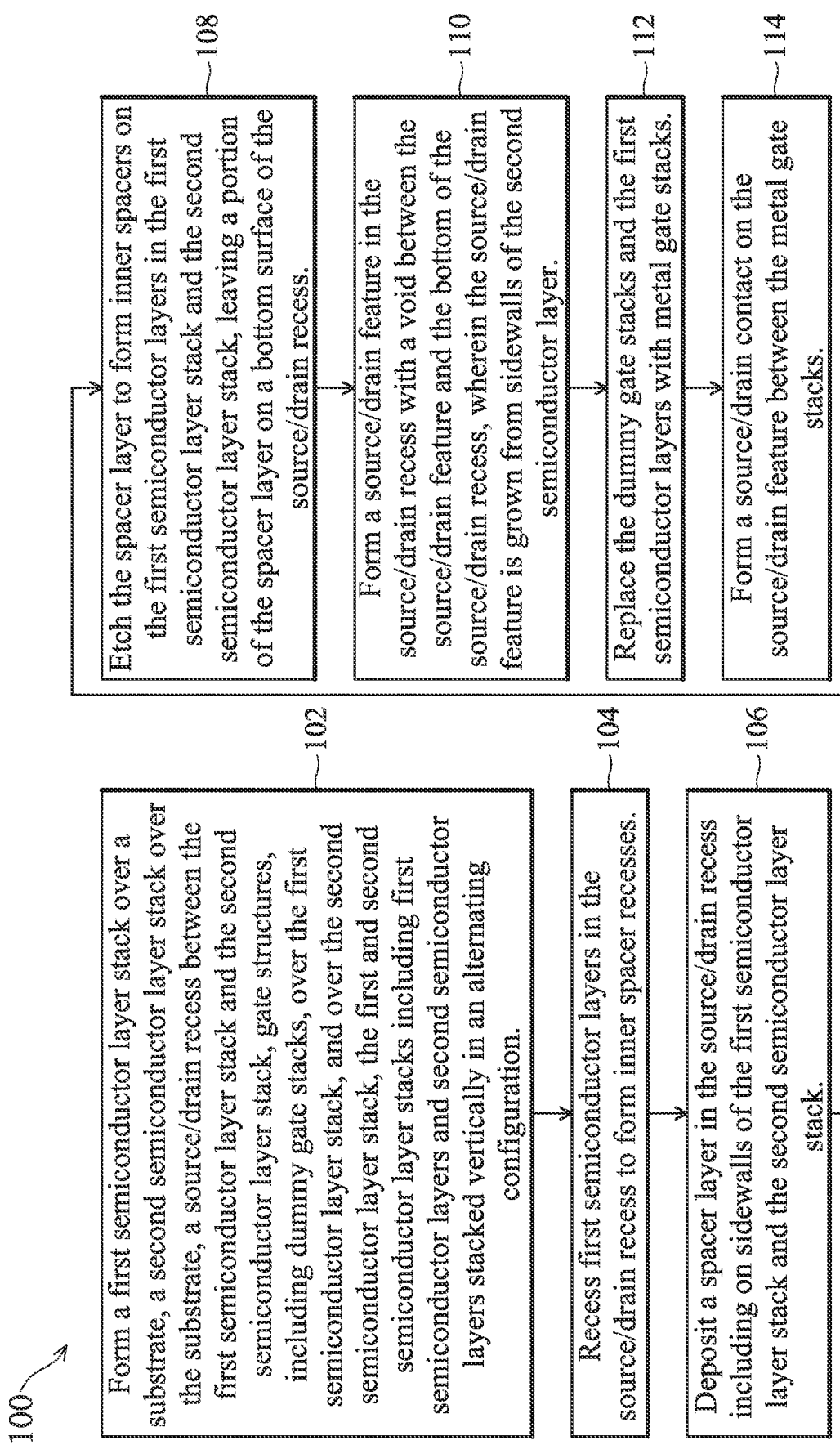
FIG. 1 is a flow chart of a method for fabricating a multigate device according to various aspects of the present disclosure.

The present disclosure relates generally to integrated circuit devices, and more particularly, to multigate devices, such as gate-all-around (GAA) devices.

The following disclosure provides many different embodiments, or examples, for implementing different features. Reference numerals and/or letters may be repeated in the various examples described herein. This repetition is for the purpose of simplicity and clarity and does not in itself dictate a relationship between the various disclosed embodiments and/or configurations. Further, specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the formation of a feature on, connected to, and/or coupled to another feature in the present disclosure may include embodiments in which the features are formed in direct contact, and may also include embodiments in which additional features may be formed interposing the features, such that the features may not be in direct contact.

Further, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used herein for ease of description to describe one element or feature's relationship to another element(s) or feature(s). The spatially relative terms are intended to encompass different orientations than as depicted of a device (or system or apparatus) including the element(s) or feature(s), including orientations associated with the device's use or operation. The apparatus may be otherwise oriented (rotated 90 degrees or at other orientations) and the spatially relative descriptors used herein may likewise be interpreted accordingly.

FIG. 1 is a flow chart of a method 100 for fabricating a multigate device according to various aspects of the present disclosure. In some embodiments, method 100 fabricates a multigate device that includes a void in the source/drain region between a source/drain feature and a bottom surface of the source/drain region. At block 102, form a first semiconductor layer stack over a substrate, a second semiconductor layer stack over the substrate, and a source/drain recess between the first semiconductor layer stack and the second semiconductor layer stack. The source/drain recess forming a first mesa structure between the substrate and the first semiconductor layer stack and a second mesa structure between the substrate and the second semiconductor layer stack Form gate structures, including dummy gate stacks, over the first semiconductor layer stack and over the second semiconductor layer stack. The first and second semiconductor layer stacks including first semiconductor layers and second semiconductor layers stacked vertically in an alternating configuration. At block 104, recess first semiconductor layers in the source/drain recess to form inner spacer recesses. At block 106, deposit a spacer layer in the source/drain recess including on sidewalls of the first semiconductor layer stack and the second semiconductor layer stack. At block 108, etch the spacer layer to form inner spacers on the first semiconductor layers in the first semiconductor layer stack and the second semiconductor layer stack, leaving a portion of the spacer layer on a bottom surface of the source/drain recess. At block 110, form a source/drain feature in the source/drain recess with a void between the source/drain feature and the bottom surface of the source/drain recess, wherein the source/drain feature is grown from sidewalls of the second semiconductor layer. At block 112, replace the dummy gate stacks and the first semiconductor layers with metal gate stacks. At block 114, form a source/drain contact on the source/drain feature between the metal gate stacks.

FIGS. 2A-2G are diagrammatic cross-sectional views of a multigate device 200 at various stages of fabrication (such as those associated with method 100 in FIG. 1) according to various aspects of the present disclosure. Multigate device 200 may be included in a microprocessor, a memory, and/or other IC device. In some embodiments, multigate device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, multigate device 200 is included in a non-volatile memory, such as a non-volatile random access memory (NVRAM), a flash memory, an electrically erasable programmable read only memory (EEPROM), an electrically programmable read-only memory (EPROM), other suitable memory type, or combinations thereof. FIGS. 2A-2G have been simplified for the sake of clarity to better understand the inventive concepts of the present disclosure. Additional features can be added in multigate device 200, and some of the features described below can be replaced, modified, or eliminated in other embodiments of multigate device 200.

Figure 2A:
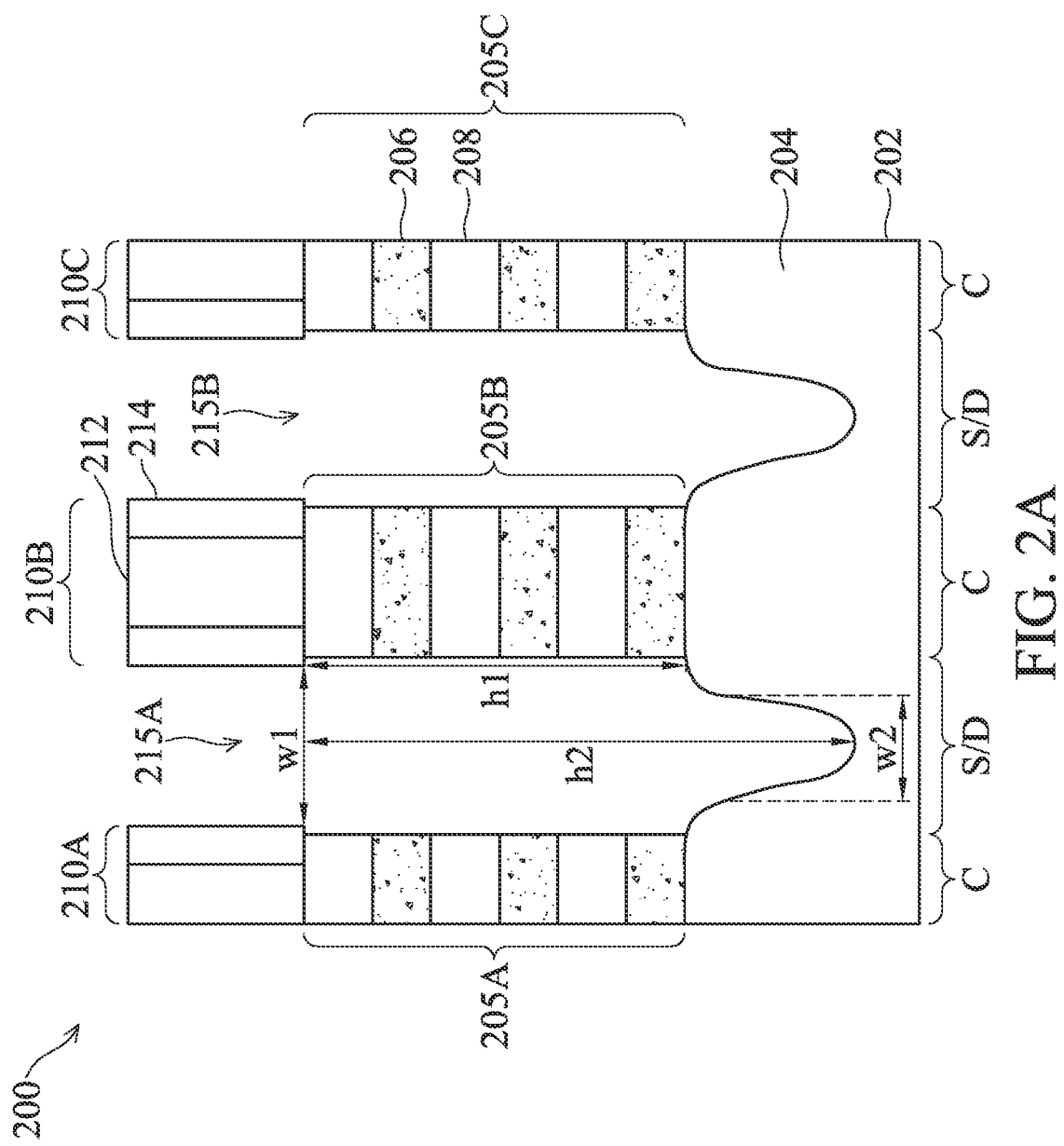
FIGS. 2A-2G are diagrammatic cross-sectional views of a multigate device at various fabrication stages (such as those associated with the method in FIG. 1) according to various aspects of the present disclosure.

Turning to FIG. 2A, multigate device 200 includes a substrate (wafer) 202. In the depicted embodiment, substrate 202 includes silicon. Alternatively or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 can include various doped regions depending on design requirements of multigate device 200.

A mesa structure 204 may be formed over substrate 202. Mesa structure 204 may also be referred to as a fin or a substrate extension. Mesa structure 204 may include silicon or another elementary semiconductor as described above with respect to substrate 202. Mesa structure 204 and substrate 202 may be formed of the same semiconductor material. Alternatively, mesa structure 204 and substrate 202 may be formed of different semiconductor material.

A semiconductor layer stack 205A, a semiconductor layer stack 205B, and a semiconductor layer stack 205C are disposed over respective mesa structures 204 in channel regions C of multigate device 200. Channel regions C are disposed between respective source/drain S/D regions of multigate device 200. Semiconductor layer stacks 205A, 205B, 205C include semiconductor layers 206 and semiconductor layers 208 stacked vertically (e.g., along the z-direction) in an interleaving or alternating configuration from a surface of substrate 202. In some embodiments, semiconductor layers 206 and semiconductor layers 208 are epitaxially grown in the depicted interleaving and alternating configuration. For example, a first one of semiconductor layers 206 is epitaxially grown on substrate 202, a first one of semiconductor layers 208 is epitaxially grown on the first one of semiconductor layers 206, a second one of semiconductor layers 206 is epitaxially grown on the first one of semiconductor layers 208, and so on until semiconductor layer stacks 205A, 205B, 205C have a desired number of semiconductor layers 206 and semiconductor layers 208. In such embodiments, semiconductor layers 206 and semiconductor layers 208 can be referred to as epitaxial layers. In some embodiments, epitaxial growth of semiconductor layers 206 and semiconductor layers 208 is achieved by a molecular beam epitaxy (MBE) process, a chemical vapor deposition (CVD) process, a metalorganic chemical vapor deposition (MOCVD) process, other suitable epitaxial growth process, or combinations thereof.

A composition of semiconductor layers 206 is different than a composition of semiconductor layers 208 to achieve etching selectivity and/or different oxidation rates during subsequent processing. In some embodiments, semiconductor layers 206 have a first etch rate to an etchant and semiconductor layers 208 have a second etch rate to the etchant, where the second etch rate is less than the first etch rate. In some embodiments, semiconductor layers 206 have a first oxidation rate and semiconductor layers 208 have a second oxidation rate, where the second oxidation rate is less than the first oxidation rate. In the depicted embodiment, semiconductor layers 206 and semiconductor layers 208 include different materials, constituent atomic percentages, constituent weight percentages, thicknesses, and/or characteristics to achieve desired etching selectivity during an etching process, such as an etching process implemented to form suspended channel layers in channel regions of multigate device 200. For example, where semiconductor layers 206 include silicon germanium and semiconductor layers 208 include silicon, a silicon etch rate of semiconductor layers 208 is less than a silicon germanium etch rate of semiconductor layers 206. In some embodiments, semiconductor layers 206 and semiconductor layers 208 can include the same material but with different constituent atomic percentages to achieve the etching selectivity and/or different oxidation rates. For example, semiconductor layers 206 and semiconductor layers 208 can include silicon germanium, where semiconductor layers 206 have a first silicon atomic percent and/or a first germanium atomic percent and semiconductor layers 208 have a second, different silicon atomic percent and/or a second, different germanium atomic percent. The present disclosure contemplates that semiconductor layers 206 and semiconductor layers 208 include any combination of semiconductor materials that can provide desired etching selectivity, desired oxidation rate differences, and/or desired performance characteristics (e.g., materials that maximize current flow), including any of the semiconductor materials disclosed herein.

As described further below, semiconductor layers 208 or portions thereof form channel regions of multigate device 200. In the depicted embodiment, semiconductor layer stacks 205A, 205B, 205C each include three semiconductor layers 206 and three semiconductor layers 208 configured to form three semiconductor layer pairs disposed over substrate 202, each semiconductor layer pair having a respective semiconductor layer 206 and a respective semiconductor layer 208. After undergoing subsequent processing, such configuration will result in multigate device 200 having three channels. However, the present disclosure contemplates embodiments where semiconductor layer stacks 205A, 205B, 205C include more or less semiconductor layers, for example, depending on a number of channels desired for multigate device 200 (e.g., a GAA transistor) and/or design requirements of multigate device 200. For example, each semiconductor layer stack 205A, 205B, 205C may include two to ten semiconductor layers 206 and two to ten semiconductor layers 208. Each semiconductor layer stack 205A, 205B, 205C has a height h1 from a top surface of a respective mesa structure 204 to a top surface of its topmost semiconductor layer (here, topmost semiconductor layer 208). In some embodiments, height h1 may be about 50 nm to about 55 nm.

Gate structures 210A, 210B, 210C are disposed over semiconductor layer stacks 205A, 205B, 205C, respectively. In some embodiments, gate structures 210A, 210B, 210C extend substantially parallel to one another along an x-direction, having a length defined in the x-direction, a width defined in a y-direction, and a height defined in a z-direction. In such embodiments, in the Y-Z plane, gate structures 210A, 210B, 210C are disposed over top surfaces of respective channel regions C of multigate device 200, such that gate structures 210A, 210B, 210C interpose respective source/drain regions S/D, such as depicted in FIG. 2A. In furtherance of such embodiments, in the X-Z plane, gate structures 210A, 210B, 210C wrap top surfaces and sidewall surfaces of semiconductor layer stacks 205A, 205B, 205C and, in some embodiments, sidewall surfaces of mesa structures 204. Each of gate structures 210A, 210B, 210C includes a dummy gate stack 212 and gate spacers 214. Dummy gate stacks 212 include a dummy gate electrode, and in some embodiments, a dummy gate dielectric. The dummy gate electrode includes a suitable dummy gate material, such as a polysilicon layer. In embodiments where dummy gate stacks 212 include a dummy gate dielectric disposed between the dummy gate electrode and semiconductor layer stacks 205A, 205B, 205C, the dummy gate dielectric includes a dielectric material, such as silicon oxide, a high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. In some embodiments, the dummy gate dielectric includes an interfacial layer (including, for example, silicon oxide) disposed over semiconductor layer stacks 205A, 205B, 205C and a high-k dielectric layer disposed over the interfacial layer. Dummy gate stacks 212 can include numerous other layers, for example, capping layers, interface layers, diffusion layers, barrier layers, hard mask layers, or combinations thereof. For example, dummy gate stacks 212 can further include a hard mask layer disposed over the dummy gate electrode.

Gate spacers 214 are disposed adjacent to (i.e., along sidewalls of) respective dummy gate stacks 212. Gate spacers 214 are formed by any suitable process and include a dielectric material. The dielectric material can include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). For example, a dielectric layer including silicon and nitrogen, such as a silicon nitride layer, can be deposited over dummy gate stacks 212 and subsequently etched (e.g., anisotropically etched) to form gate spacers 214. In some embodiments, gate spacers 214 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to dummy gate stacks 212. In such implementations, the various sets of spacers can include materials having different etch rates. For example, a first dielectric layer including silicon and oxygen (e.g., silicon oxide) can be deposited and etched to form a first spacer set adjacent to dummy gate stacks 212, and a second dielectric layer including silicon and nitrogen (e.g., silicon nitride) can be deposited and etched to form a second spacer set adjacent to the first spacer set.

At the stage of processing in FIG. 2A, source/drain recesses 215A, 215B have been formed in source/drain regions S/D of multigate device 200, for example, by an etching process. Gate structures 210A, 210B, 201C are thus disposed between respective source/drain recesses 215A, 215B. In the depicted embodiment, source/drain recesses 215A, 215B are formed by an etching process that completely removes a portion of semiconductor layers 206 and semiconductor layers 208 in source/drain regions S/D of multigate device 200 and partially removes a portion of substrate 202 in source/drain regions S/D of multigate device 200, thereby forming semiconductor layer stacks 205A, 205B, 205C and mesa structures 204 in the channel regions C of multigate device 200. After the source/drain etching process, source/drain recesses 215A, 215B have sidewalls formed by remaining portions of semiconductor layers 206 and semiconductor layers 208 in channel regions C (i.e., semiconductor layer stacks 205A, 205B, 205C) and bottoms formed by substrate 202. In the depicted embodiment, the etching process further removes some, but not all, of substrate 202, such that source/drain recesses 215A, 215B extend below a topmost surface of substrate 202, thereby forming mesa structures 204. The etching process may include a dry etching process, a wet etching process, other suitable etching process, or combinations thereof. In some embodiments, the etching process is a multi-step etch process. For example, a first etch process, that is an anisotropic etch, may etch the source/drain regions S/D more in a vertical direction than in a horizontal direction. The first etch process may include one of $Cl_2$, $CHCl_3$, HBr, and/or $CHBr_3$ as the etchant. A second etch process, that is an isotropic etch, may etch the source/drain regions S/D in multiple directions. The second etch process may include one of $CF_4$, $SF_6$, $CH_2F_2$, $CHF_3$, and/or $C_2F_6$ as the etchant. A conventional source/drain recess may have a U-shaped profile at the bottom. The U-shaped profile formed by vertical sidewalls and a flat bottom portion of the source/drain recess. By contrast, after performing the etching process as described herein, the sidewalls of the bottom of the source/drain recesses 215A, 215B are tapered, having a decreasing width between the sidewalls near the bottom. The tapered sidewalls form a V-shaped profile in source/drain recesses 215A, 215B. The benefits of the V-shaped source/drain recess profile are discussed further below. In some embodiments, a lithography process, such as those described herein, is performed to form a patterned mask layer that covers dummy gate stacks 212 and gate spacers 214 and the etching process uses the patterned mask layer as an etch mask.

Following the multi-step etching process source/drain recesses 215A, 215B have a height h2 from the bottom of source/drain recesses 215A, 215B (formed by substrate 202) to a bottom surface of the dummy gate structures 210A, 210B, 210C. In some embodiments, height h2 may be about 60 nm to about 70 nm. Source/drain recesses 215A, 215B have a width w1 across a top portion between adjacent semiconductor layer stacks (e.g., width w1 between semiconductor layer stack 205A and semiconductor layer stack 205B). In some embodiments, width w1 may be about 20 nm to about 25 nm. Source/drain recesses 215A, 215B have a width w2 across a bottom portion between adjacent mesa structures 204. In some embodiments, width w2 may be about 10 nm to about 15 nm.

Figure 2B:
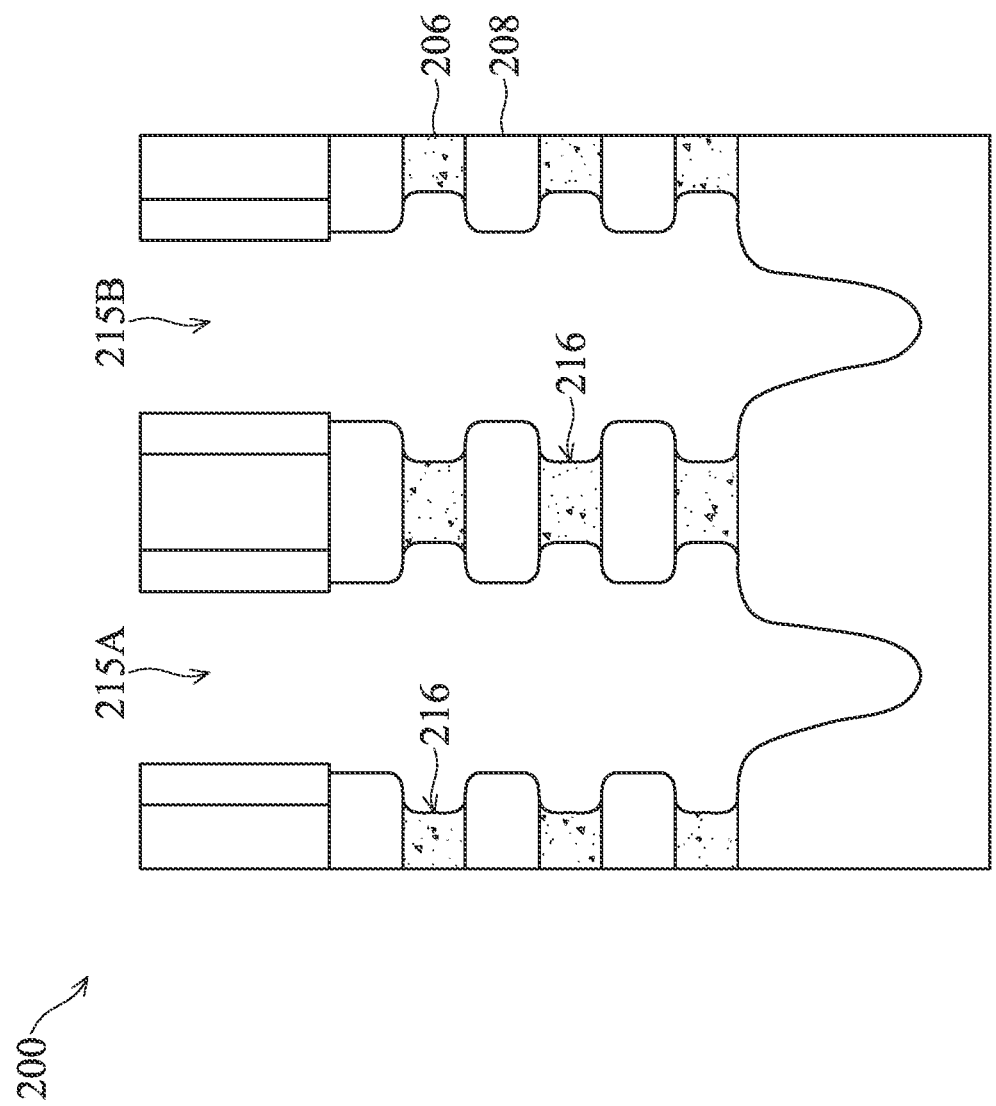

Turning to FIG. 2B, semiconductor layers 206 are recessed to form inner spacer recesses 216. In some embodiments, semiconductor layers 206 exposed in the source/drain regions S/D are selectively and partially recessed to form inner spacer recesses 216 with little, to no, etching of semiconductor layers 208, such that gaps are formed between semiconductor layers 208 and between semiconductor layers 208 and mesa structures 204 under gate spacers 214. In some embodiments, the gaps extend partially under dummy gate stacks 212. In some embodiments, the selective recess may be a selective isotropic etching process (e.g., a selective dry etching process or a selective wet etching process), and the extent the semiconductor layers 206 are recessed (e.g., along the y-direction) is controlled by the duration of the etching process. In the depicted embodiment, a selective dry etching process uses a fluorine-based etchant, such as a combination of HF and $F_2$, to form inner spacer recesses 216. In some embodiments, the selective dry etching process uses one or more fluorine-based etchants, such as $CF_4$, $SF_6$, $C_2F_6$, $F_2$, and/or HF.

Figure 2C:
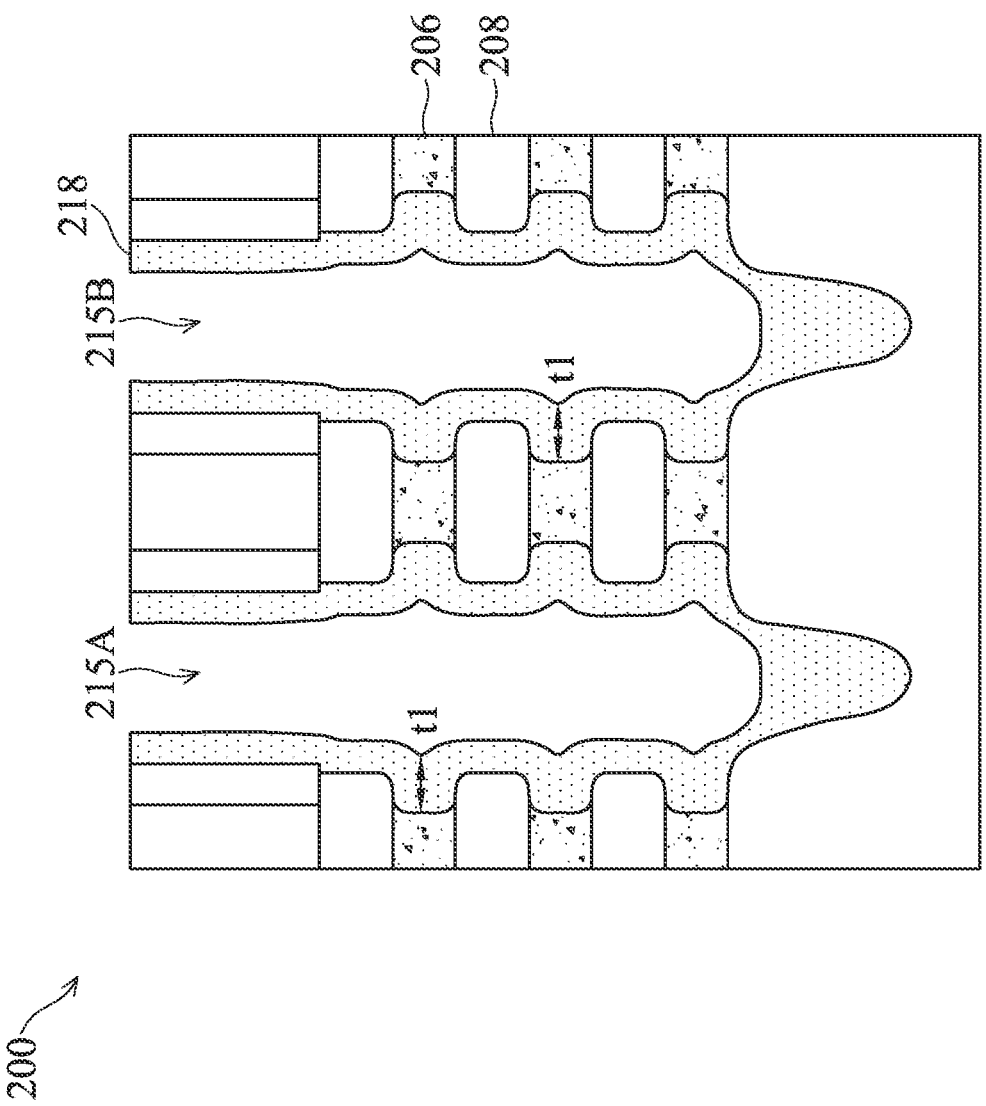

Turning to FIG. 2C, a spacer layer 218 is deposited over multigate device 200 including along sidewalls of gate structures 210A, 210B, 210C, sidewalls of semiconductor layer stacks 205A, 205B, 205C, and along a bottom of the source/drain recesses 215A, 215B. In a conventional U-shaped source/drain recess, the spacer layer 218 may be uniformly deposited along the sidewalls and the bottom surface of the source/drain recess. By contrast, the V-shaped profile described in the present disclosure allows the spacer layer 218 to fill the bottom of source/drain recesses 215A, 215B. The benefits of this will be described further below. Spacer layer 218 has a thickness t1 on semiconductor layer 206. In some embodiments, thickness t1 may be about 6 nm to about 10 nm. Spacer layer 218 may be deposited uniformly over multigate device 200. A deposition process forms spacer layer 218 over dummy gate stacks 212, gate spacers 214, and over features forming source/drain recesses 215A, 215B (e.g., semiconductor layers 208, semiconductor layers 206, mesa structures 204, and substrate 202), such as CVD, PVD, ALD, HDPCVD, MOCVD, RPCVD, PECVD, LPCVD, ALCVD, APCVD, plating, other suitable methods, or combinations thereof. Spacer layer 218 partially (and, in some embodiments, completely) fills the source/drain recesses 215A, 215B. The deposition process is configured to ensure that the spacer layer 218 fills the inner spacer recesses 216 between semiconductor layers 208 and between semiconductor layers 208 and mesa structures 204 under gate spacers 214. Spacer layer 218 includes a material that is different than a material of semiconductor layers 208 and a material of gate spacers 214 to achieve desired etching selectivity during a subsequent etching process. In some embodiments, spacer layer 218 includes a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the spacer layer includes a low-k dielectric material, such as those described herein. In some embodiments, dopants (for example, p-type dopants, n-type dopants, or combinations thereof) are introduced into the dielectric material, such that spacer layer includes a doped dielectric material.

Figure 2D:
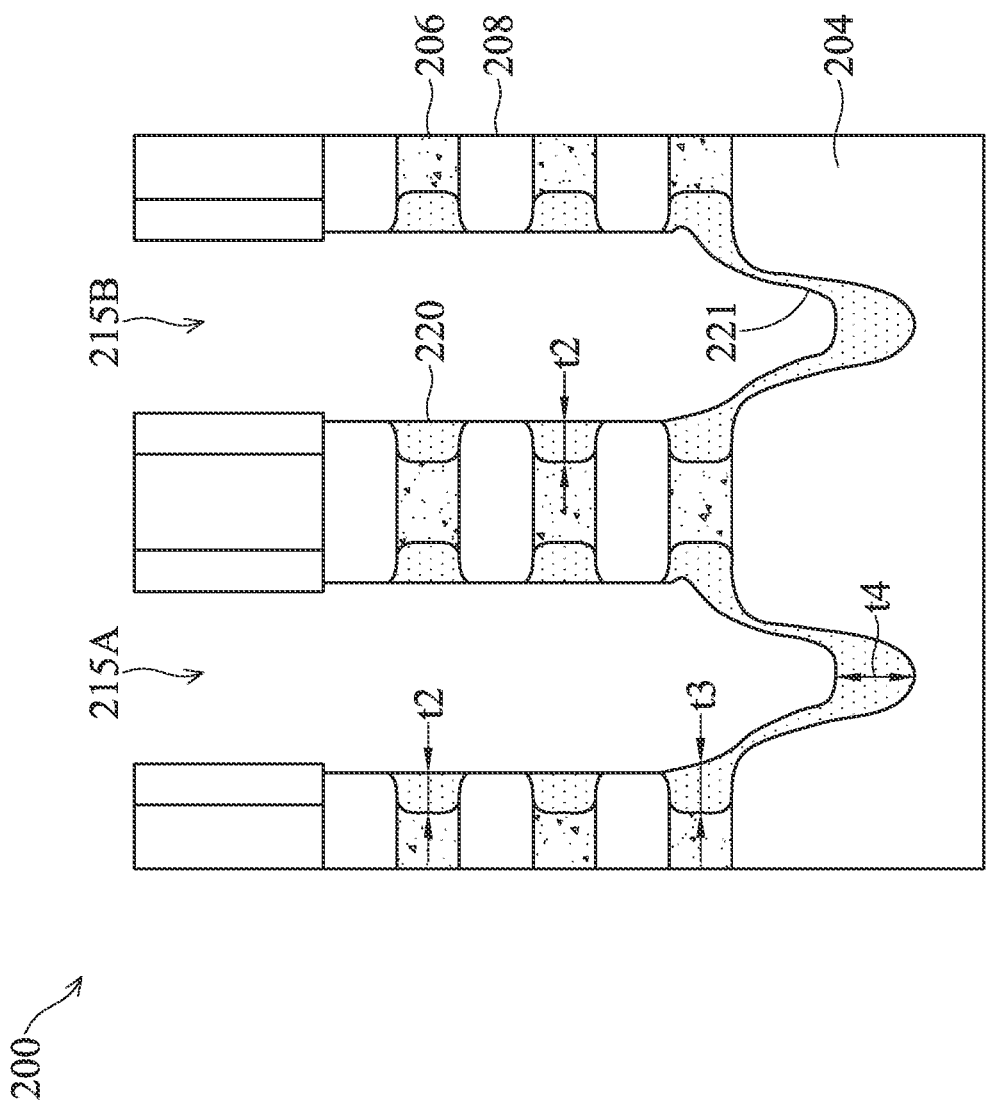

Turning to FIG. 2D, an etching process is performed that etches spacer layer 218 to form inner spacers 220 and bottom inner spacers 221. Inner spacers 220 have a thickness t2 on semiconductor layers 206. In some embodiments, thickness t2 may be about 1 nm to about 3 nm. Inner spacers 220 have a thickness t3 on semiconductor layers 206 between semiconductor layers 208 and mesa structure 204. In the depicted embodiment, thickness t3 is greater than thickness t2. In some embodiments, thickness t3 may be about 2 nm to about 6 nm. Bottom inner spacers 221 have a thickness t4 extending from substrate 202 vertically to the top surface of bottom inner spacers 221. In the depicted embodiment, thickness t4 is greater than thickness t3. In some embodiments, thickness t4 may be about 3 nm to about 7 nm. A thickness of bottom inner spacers 221 along sidewalls of mesa structures 204 is less than thickness t3 and thickness t4. The etching process selectively etches spacer layer 218 with minimal (to no) etching of semiconductor layers 208, dummy gate stacks 212, and gate spacers 214. In some embodiments, the spacer layer is removed from sidewalls of gate spacers 214, sidewalls of semiconductor layers 208, and dummy gate stacks 212. In some embodiments, the etching process may be a dry trim process. The dry etching process may include the use of etchants such as $NF_3$ and HBr. The etching process may be an isotropic etching process that etches spacer layer 218 in all directions to form inner spacers 220 and bottom inner spacers 221. In a conventional process, bottom inner spacers 221 may be disposed along sidewalls of semiconductor layers 206 and over top surfaces of mesa structures 204 but not along the bottom surface of source/drain recesses 215A, 215B. By contrast, the etching process disclosed herein is tuned to leave bottom inner spacer 221 along the bottom of source/drain recesses 215A, 215B including along sidewalls of mesa structure 204 and on substrate 202. That is, the bottom inner spacer 221 is connected along the bottom of source/drain recesses 215A, 215B, filling the V-shaped profile of source/drain recesses 215A, 215B. Benefits of bottom inner spacer 221 being disposed over the bottom of source/drain recesses 215A, 215B will be discussed further below.

Figure 2E:
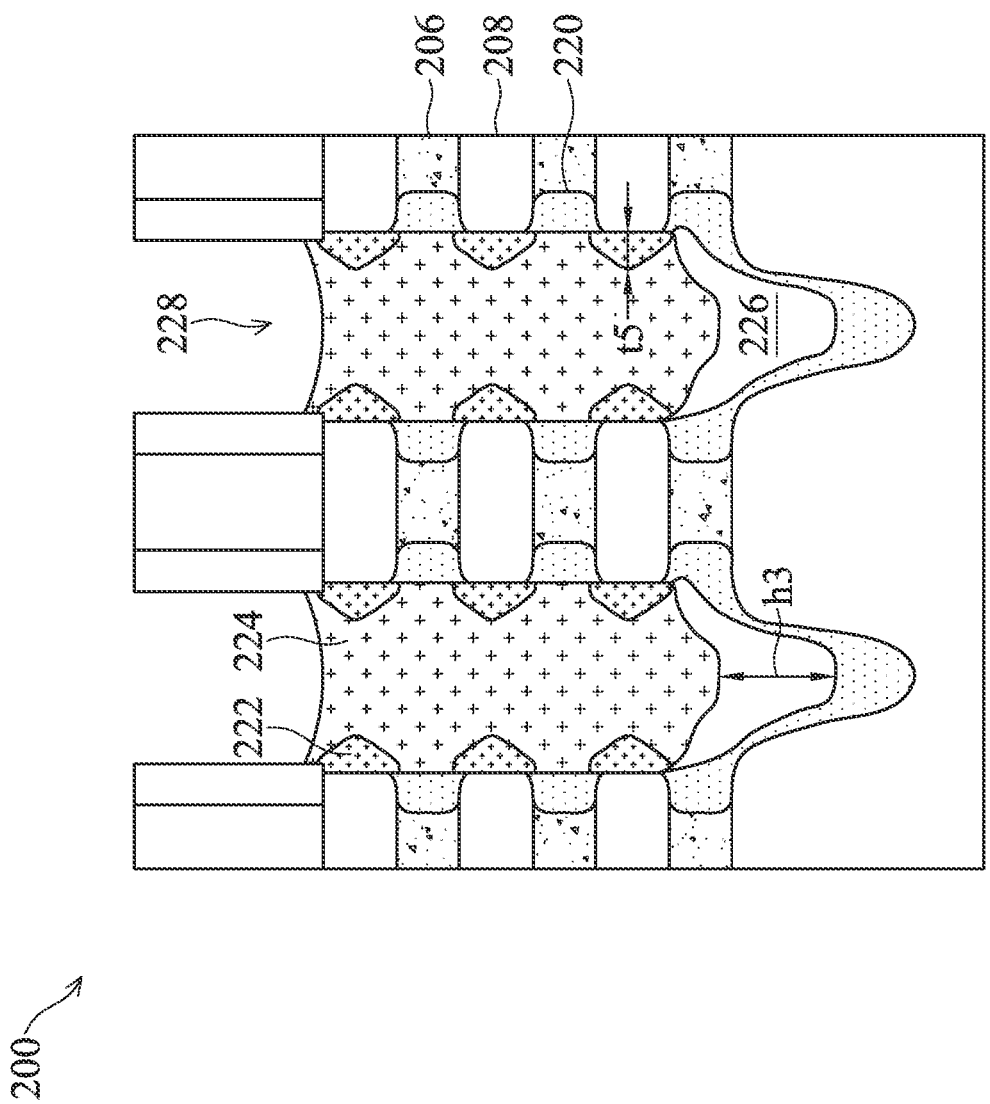

Turning to FIG. 2E, processing proceeds with forming epitaxial source/drain features 228 in source/drain recesses 215A, 215B. As described below, the epitaxial source/drain features 228 have characteristics that may reduce bottom leakage of multigate device 200. A first epitaxial layer 222 is formed on semiconductor layers 208 in source/drain recesses 215A, 215B. First epitaxial layer 222 is not formed on bottom inner spacers 221 (e.g., along sidewalls of mesa structure 204 and on substrate 202) or on inner spacers 220. In some embodiments, the epitaxy process is performed until first epitaxial layer 222 covers exposed surfaces of semiconductor layers 208 in source/drain recesses 215A, 215B. In the depicted embodiment, first epitaxial layer 222 includes separate portions that are not connected (or merged) to one another. For example, since first epitaxial layer 222 is not formed on inner spacers 220, portions of first epitaxial layer 222 disposed on adjacent semiconductor layers 208 are not connected to one another and first epitaxial layer 222 is not formed on bottom inner spacers 221 along the bottom of source/drain recesses 215A, 215B. In some embodiments, first epitaxial layer 222 may cover a portion of inner spacers 220 between semiconductor layers 208 and a portion of gate spacers 214 adjacent semiconductor layers 208. First epitaxial layer 222 has a thickness t5 on semiconductor layers 208. In some embodiments, thickness t5 may be about 5 nm to about 10 nm. At this stage, the source/drain recesses 215A, 215B are formed by inner spacers 220, first epitaxial layer 222, and bottom inner spacers 221.

Processing continues with forming a second epitaxial layer 224 on first epitaxial layer 222 in source/drain recesses 215A, 215B. Second epitaxial layer 224 grows on first epitaxial layer 222 merging between first epitaxial layers 222 and over inner spacers 220. As second epitaxial layer 224 continues to grow, epitaxial layer 224 merges into a continuous layer filling the source/drain recesses 215A, 215B between semiconductor layers 208 and inner spacers 220. Bottom inner spacers 221 disposed along mesa structures 204 and substrate 202 prevents second epitaxial layer 224 from growing in bottoms of source/drain recesses 215A, 215B, such that a void 226 remains at the bottoms of source/drain recesses 215A, 215B after second epitaxial layer 224 has merged. In the depicted embodiment, voids 226 are bounded by second epitaxial layer 224 and bottom inner spacers 221 in source/drain recesses 215A, 215B. Additionally, second epitaxial layer 224 does not directly, or physically, contact mesa structures 204, substrate 202, or bottom inner spacers 221 disposed over mesa structures 204 and substrate 202. Voids 226 have a height h3 from a top portion of bottom inner spacers 221 disposed on substrate 202 to a bottom of second epitaxial layer 224. In some embodiments, height h3 may be about 10 nm to about 20 nm. Voids 226 are V-shaped, similar to bottom inner spacers 221, having a top portion with a top width and a bottom portion with a bottom width where the top width is wider than the bottom width. That is, voids 226 have a tapered width that decreases from the top portion to the bottom portion. Additionally, voids 226 have different heights on the either side (or end) of voids 226 as compared to the middle of the voids 226. The middle of voids 226 has the greatest height, as depicted by height h3. The height of voids 226 decreases from the middle to the sides. Forming void 226 (also referred to as empty space, air gap, and/or a gap) provides many advantages. For example, providing empty space, such as void 226, isolates the mesa structures 204 and reduces leakage of the multigate device 200. As another example, having an air gap, such as void 226, improves the Ion and Ioff performance of multigate device 200. Additionally, void 226 may reduce the area of the N well pickup for a PMOS transistor and a P well pickup for an NMOS transistor.

Continuing with FIG. 2E, second epitaxial layer 224 overfills source/drain recesses 215A, 215B, such that a portion of second epitaxial layer 224 is disposed between gate structures 210A, 210B, 210C. Second epitaxial layer 224 and first epitaxial layer 222 collectively form epitaxial source/drain features 228 of multigate device 200. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of first epitaxial layer 222. Second epitaxial layer 224 may be doped with n-type dopants and/or p-type dopants. In some embodiments, for n-type GAA transistors, second epitaxial layer 224 includes silicon. In such embodiments, second epitaxial layer 224 can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for p-type GAA transistors, second epitaxial layer 224 includes silicon germanium or germanium. In such embodiments, second epitaxial layer 224 can be doped with boron, other p-type dopant, or combinations thereof (for example, forming Si:Ge:B epitaxial source/drain features). In some embodiments, second epitaxial layer 224 includes more than one epitaxial semiconductor layer, where the epitaxial semiconductor layers can include the same or different materials and/or dopant concentrations. In some embodiments, second epitaxial layer 224 includes materials and/or dopants that achieve desired tensile stress and/or compressive stress in channel regions. In some embodiments, second epitaxial layer 224 is doped during deposition by adding impurities to a source material of the epitaxy process (i.e., in-situ). In some embodiments, second epitaxial layer 224 is doped by an ion implantation process subsequent to a deposition process. In some embodiments, annealing processes (e.g., rapid thermal annealing (RTA) and/or laser annealing) are performed to activate dopants in second epitaxial layer 224 and/or other source/drain regions (for example, heavily doped source/drain regions and/or lightly doped source/drain (LDD) regions).

In some embodiments, second epitaxial layer 224 is formed of the same material as the first epitaxial layer 222. In some embodiments, second epitaxial layer 224 is formed of a different material than first epitaxial layer 222. In some embodiments, a doping concentration of a dopant in second epitaxial layer 224 is different (for example, greater or less) than a doping concentration of the dopant in first epitaxial layer 222.

Figure 2F:
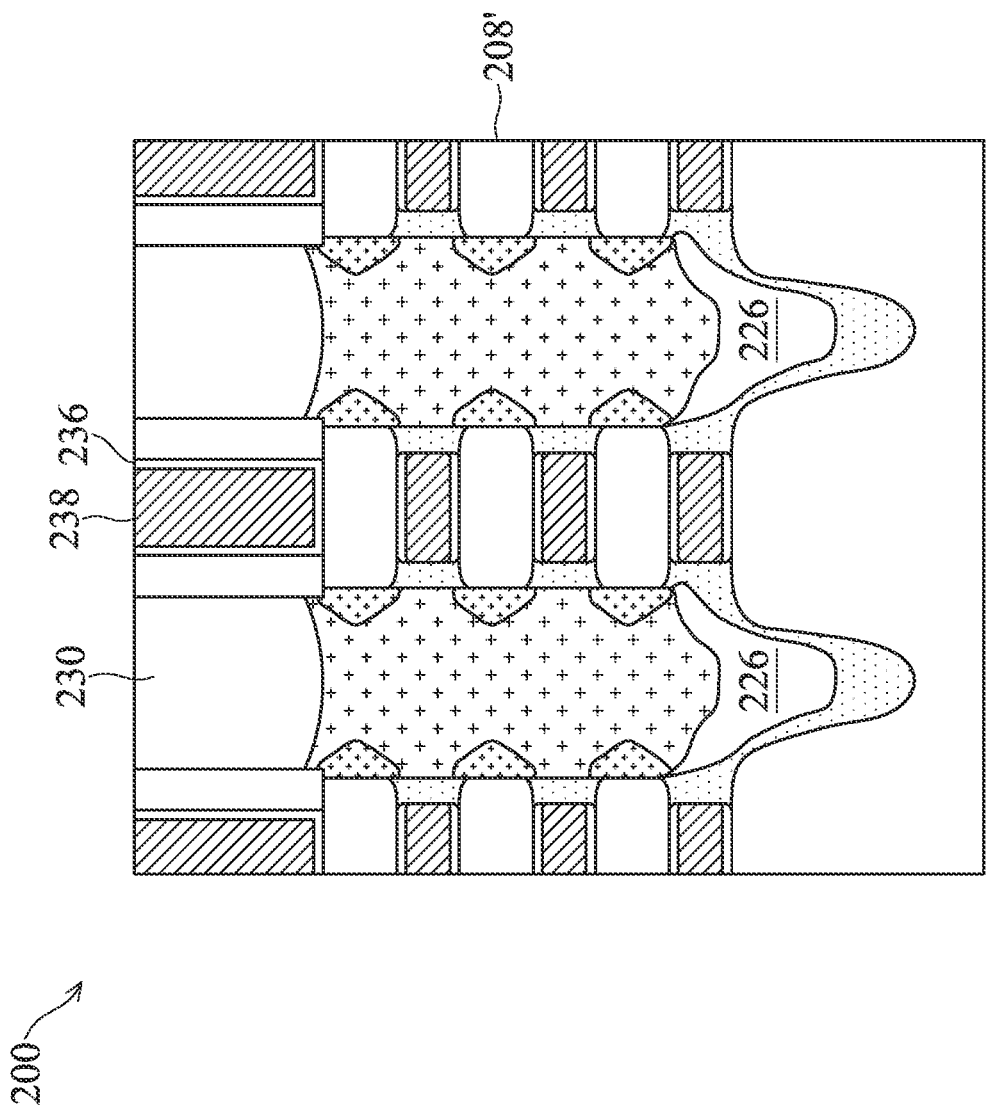

Turning to FIG. 2F, an inter-level dielectric (ILD) layer 230 is formed over epitaxial source/drain features 228 (in particular, second epitaxial layer 224), dummy gates 212, and gate spacers 214, for example, by a deposition process (such as CVD, PVD, ALD, HDPCVD, MOCVD, RPCVD, PECVD, LPCVD, ALCVD, APCVD, plating, other suitable methods, or combinations thereof). In some embodiments, ILD layer 230 is formed by a flowable CVD (FCVD) process that includes, for example, depositing a flowable material (such as a liquid compound) over multigate device 200 and converting the flowable material to a solid material by a suitable technique, such as thermal annealing and/or ultraviolet radiation treating. ILD layer 230 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SILK (Dow Chemical, Midland, Michigan), polyimide, other low-k dielectric material, or combinations thereof. In the depicted embodiment, ILD layer 230 is a dielectric layer that includes a low-k dielectric material (generally referred to as a low-k dielectric layer). ILD layer 230 can include a multilayer structure having multiple dielectric materials. In some embodiments, a contact etch stop layer (CESL) is disposed between ILD layer 230 and second epitaxial layer 224 and between ILD layer 230 and gate spacers 214. The CESL includes a material different than ILD layer 230, such as a dielectric material that is different than the dielectric material of ILD layer 230. For example, where ILD layer 230 includes a low-k dielectric material, the CESL includes silicon and nitrogen, such as silicon nitride or silicon oxynitride. Subsequent to the deposition of ILD layer 230 and/or the CESL, a CMP process and/or other planarization process can be performed until reaching (exposing) a top portion (or top surface) of dummy gate stacks 212. In some embodiments, the planarization process removes hard mask layers to expose underlying dummy gate electrodes of dummy gate stacks 212, such as polysilicon gate electrode layers.

ILD layer 230 may be a portion of a multilayer interconnect (MLI) feature disposed over substrate 202. The MLI feature electrically couples various devices (for example, p-type GAA transistors and/or n-type GAA transistors of multigate device 200, transistors, resistors, capacitors, and/or inductors) and/or components (for example, gate structures and/or epitaxial source/drain features of multigate device 200), such that the various devices and/or components can operate as specified by design requirements of multigate device 200. The MLI feature includes a combination of dielectric layers and electrically conductive layers (e.g., metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of the MLI feature. During operation, the interconnect features are configured to route signals between the devices and/or the components of multigate device 200 and/or distribute signals (for example, clock signals, voltage signals, and/or ground signals) to the devices and/or the components of multigate device 200.

Continuing with FIG. 2F, dummy gate stacks 212 are removed to form gate trenches that expose semiconductor layer stacks 205A, 205B, 205C in channel regions C of multigate device 200. In some embodiments, an etching process completely removes dummy gate stacks 212 to expose semiconductor layers 206 and semiconductor layers 208' of semiconductor layer stacks 205A, 205B. The etching process is a dry etching process, a wet etching process, other suitable etching process, or combinations thereof. In some embodiments, the etching process is a multi-step etch process. For example, the etching process may alternate etchants to separately remove various layers of dummy gate stacks 212, such as the dummy gate electrode layers, the dummy gate dielectric layers, and/or the hard mask layers. In some embodiments, the etching process is configured to selectively etch dummy gate stacks 212 with minimal (to no) etching of other features of multigate device 200, such as ILD layer 230, gate spacers 214, semiconductor layers 206, and semiconductor layers 208'. In some embodiments, a lithography process, such as those described herein, is performed to form a patterned mask layer that covers ILD layer 230 and/or gate spacers 214, and the etching process uses the patterned mask layer as an etch mask.

Continuing with FIG. 2F, semiconductor layers 206 exposed by the gate trenches are then selectively removed from the channel regions C of multigate device 200, thereby leaving suspended, channel layers 208'. In the depicted embodiment, removing semiconductor layers 206 provides three channel layers 208' through which current will flow between respective epitaxial source/drain features during operation of multigate device 200. In some embodiments, this process may be referred to as a channel nanowire release process, where each channel layer 208' has nanometer-sized dimensions and can be referred to as a nanowire. "Nanowire" generally refers to a channel layer suspended in a manner that will allow a metal gate to physically contact at least two sides of the channel layer, and in GAA transistors, will allow the metal gate to physically contact at least four sides of the channel layer (i.e., surround the channel layer).

In such embodiments, a vertical stack of suspended channel layers can be referred to as a nanostructure. In some embodiments, after removing semiconductor layers 206, an etching process is performed to modify a profile of channel layers 208' to achieve desired dimensions and/or desired shapes (e.g., cylindrical-shaped (e.g., nanowire), rectangular-shaped (e.g., nanobar), sheet-shaped (e.g., nanosheet), etc.). The present disclosure further contemplates embodiments where the channel layers 208' (nanowires) have sub-nanometer dimensions depending on design requirements of multigate device 200.

In some embodiments, an etching process selectively etches semiconductor layers 206 with minimal (to no) etching of semiconductor layers 208' and, in some embodiments, minimal (to no) etching of gate spacers 214 and/or inner spacers 220. Various etching parameters can be tuned to achieve selective etching of semiconductor layers 206, such as etchant composition, etching temperature, etching solution concentration, etching time, etching pressure, source power, RF bias voltage, RF bias power, etchant flow rate, other suitable etching parameters, or combinations thereof. For example, an etchant is selected for the etching process that etches the material of semiconductor layers 206 (e.g., silicon germanium) at a higher rate than the material of semiconductor layers 208' (e.g., silicon) (i.e., the etchant has a high etch selectivity with respect to the material of semiconductor layers 206). The etching process is a dry etching process, a wet etching process, other suitable etching process, or combinations thereof. In some embodiments, a dry etching process (such as an RIE process) utilizes a fluorine-containing gas (for example, SF6) to selectively etch semiconductor layers 206. In some embodiments, a ratio of the fluorine-containing gas to an oxygen-containing gas (for example, O2), an etching temperature, and/or an RF power may be tuned to selectively etch silicon germanium or silicon. In some embodiments, a wet etching process utilizes an etching solution that includes ammonium hydroxide (NH4OH) and water (H2O) to selectively etch semiconductor layers 206. In some embodiments, a chemical vapor phase etching process using hydrochloric acid (HCl) selectively etches semiconductor layers 206.

Metal gate stacks, which include a gate dielectric 236 (for example, a gate dielectric layer) and a gate electrode 238 (for example, a work function layer and a bulk conductive layer), are then formed in the gate trenches. In FIG. 2F, metal gate stacks wrap (surround) channel layers 208', where gate dielectric 236 is disposed between gate electrode 238 and channel layers 208'. A bottom portion of the metal gate stacks is disposed between bottom channel layers 208' and mesa structures 204. Bottom inner spacers 220 are disposed on sidewalls of bottom portions of adjacent metal gate stacks, such that bottom inner spacers 221 along bottom portions of the metal gate stacks are connected. That is, bottom inner spacers 221 are disposed along the bottoms of source/drain recesses 215A, 215B and connected to a first inner spacer disposed on a sidewall of a first metal gate stack and a second inner spacer disposed on a sidewall of a second metal gate stack. Metal gate stacks may include numerous other layers, for example, capping layers, interface layers, diffusion layers, barrier layers, hard mask layers, or combinations thereof. In the depicted embodiment, gate dielectric 236 includes a high-k dielectric layer, which includes a high-k dielectric material, such as HfO2, HfSiO, HfSiO4, HfSiON, HfLaO, HfTaO, HfTiO, HfZrO, HfAlOx, ZrO, ZrO2, ZrSiO2, AlO, AlSiO, Al2O3, TiO, TiO2, LaO, LaSiO, Ta2O3, Ta2O5, Y2O3, SrTiO3, BaZrO, BaTiO3 (BTO), (Ba,Sr)TiO3 (BST), Si3N4, hafnium dioxide-alumina (HfO2-Al2O3) alloy, other suitable high-k dielectric material, or combinations thereof. High-k dielectric material generally refers to dielectric materials having a high dielectric constant, for example, greater than that of silicon oxide (k~3.9). The high-k dielectric layer is formed by any of the processes described herein, such as ALD, CVD, PVD, oxidation-based deposition process, other suitable process, or combinations thereof. In some embodiments, gate dielectric 236 includes an interfacial layer disposed between the high-k dielectric layer and channel layers 208'.

Gate electrode 238 includes a conductive material, such as polysilicon, Al, Cu, Ti, Ta, W, Mo, Co, TaN, NiSi, CoSi, TiN, WN, TiAl, TiAlN, TaCN, TaC, TaSiN, other conductive material, or combinations thereof. In some embodiments, the work function layer is a conductive layer tuned to have a desired work function (e.g., an n-type work function or a p-type work function), and the conductive bulk layer is a conductive layer formed over the work function layer. In some embodiments, the work function layer is an n-type work function layer and includes any suitable work function material, such as Ti, Al, Ag, Mn, Zr, TiAl, TiAlC, TiAlSiC, TaC, TaCN, TaSiN, TaAl, TaAlC, TaSiAlC, TiAlN, other n-type work function material, or combinations thereof. In some embodiments, the work function layer includes a p-type work function material such as Ru, Mo, Al, TiN, TaN, WN, ZrSi2, MoSi2, TaSi2, NiSi2, WN, other suitable p-type work function materials, or combinations thereof. The bulk (or fill) conductive layer includes a suitable conductive material, such as Al, W, and/or Cu. The bulk conductive layer may additionally or collectively include polysilicon, Ti, Ta, metal alloys, other suitable materials, or combinations thereof. The work function layer and/or the conductive bulk layer are formed by any of the processes described herein, such as ALD, CVD, PVD, plating, other deposition process, or combinations thereof.

Figure 2G:
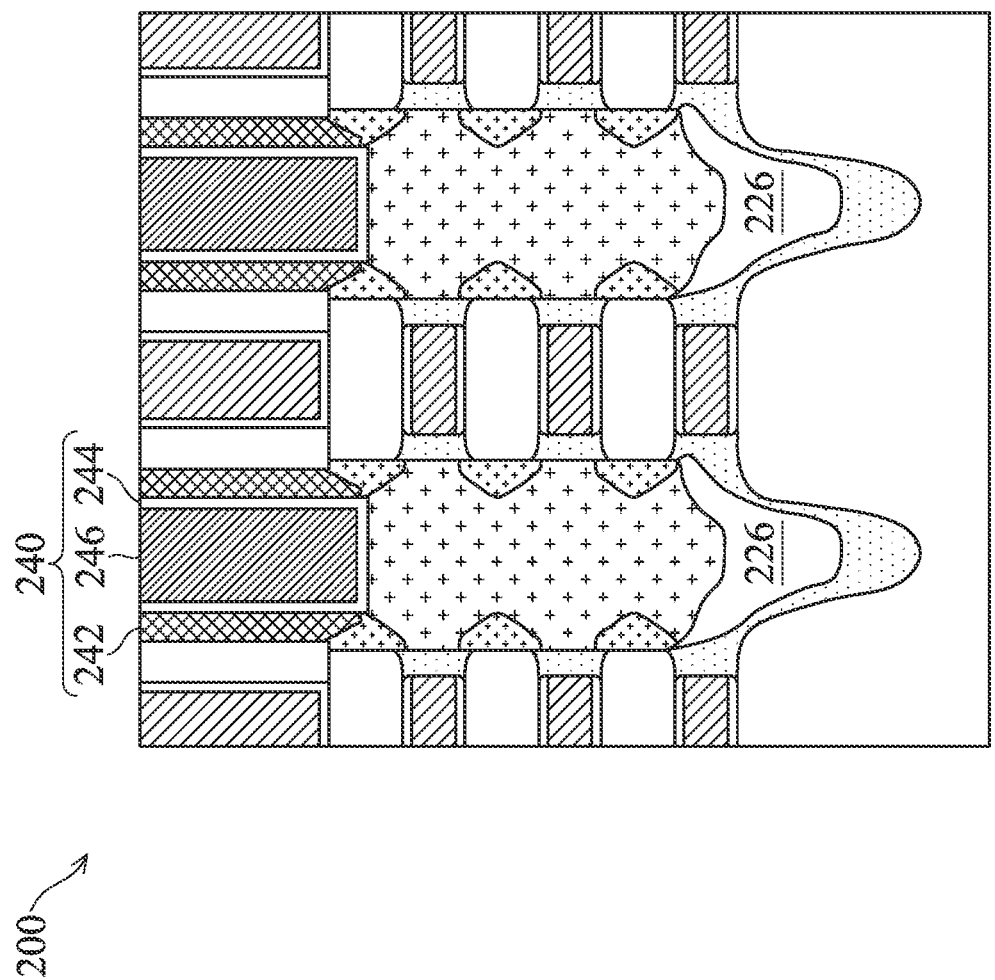

Turning to FIG. 2G, a source/drain contact opening is formed that exposes source/drain feature 228. A source/drain contact 240 is then formed on source/drain feature 228 and fills the source/drain contact opening. In some embodiments, a silicide layer may be formed in the source/drain contact opening and on the source/drain feature 228 before forming source/drain contact 240. Source/drain contact 240 includes a contact isolation layer 242, a contact barrier layer 244, and a contact bulk layer 246. In some embodiments, contact isolation layer 242 is formed on source/drain feature 228 and on sidewalls of gate spacers 214. In some embodiments, where the source/drain contact opening does not expose gate spacers 214, ILD layer 230 is disposed between source/drain contact 240 (here, in particular, contact isolation layer 242) and gate spacers 214. In some embodiments, contact isolation layer 242 may be disposed on exposed first epitaxial layer 222. Contact barrier layer 244 is formed on source/drain feature 228 and on contact isolation layer 242. Contact bulk layer 246 is formed on contact barrier layer 244. In some embodiments, source/drain contact 240 is formed by performing a first deposition process to form a contact isolation material over second epitaxial layer 224 and on sidewalls of gate spacers 214, where the contact isolation material partially fills the source/drain contact opening; performing a second deposition process to form a contact barrier material over the contact isolation material, where the contact barrier material partially fills the source/drain contact opening; and performing a third deposition process to form a contact bulk material over the contact barrier material, where the contact bulk material fills a remainder of the source/drain contact opening. In such embodiments, contact barrier material and contact bulk material are disposed in the source/drain contact opening and over the top surface of source/drain feature 228, specifically second epitaxial layer 224. The first deposition process, the second deposition process, and the third deposition process can include CVD, PVD, ALD, HDPCVD, MOCVD, RPCVD, PECVD, LPCVD, ALCVD, APCVD, PEALD, electroplating, electroless plating, other suitable deposition methods, or combinations thereof. In some embodiments, contact barrier layer 244 has a substantially uniform thickness along sidewalls of contact isolation layer 242 and along the top source/drain feature 228. Contact barrier layer 244 may thus be formed by a conformal deposition process. A CMP process and/or other planarization process is performed to remove excess contact bulk material, contact barrier material, and/or contact isolation material, for example, from over the top surface of ILD layer 230 and gate structures 210A, 210B, 210C resulting in source/drain contact 240 (in other words, contact isolation layer 242, contact barrier layer 244, and contact bulk layer 246 filling the source/drain contact opening).

Contact barrier layer 244 includes a material that promotes adhesion between a surrounding dielectric material (here, contact isolation layer 242) and contact bulk layer 246. The material of contact barrier layer 244 may further prevent diffusion of metal constituents (for example, metal atoms/ions) from source/drain contact 240 into the surrounding dielectric material. In some embodiments, contact barrier layer 244 includes titanium, titanium alloy, tantalum, tantalum alloy, cobalt, cobalt alloy, ruthenium, ruthenium alloy, molybdenum, molybdenum alloy, palladium, palladium alloy, other suitable constituent configured to promote and/or enhance adhesion between a metal material and a dielectric material and/or prevent diffusion of metal constituents from the metal material to the dielectric material, or combinations thereof. For example, contact barrier layer 244 includes tantalum, tantalum nitride, tantalum aluminum nitride, tantalum silicon nitride, tantalum carbide, titanium, titanium nitride, titanium silicon nitride, titanium aluminum nitride, titanium carbide, tungsten, tungsten nitride, tungsten carbide, molybdenum nitride, cobalt, cobalt nitride, ruthenium, palladium, or combinations thereof. In some embodiments, contact barrier layer 244 includes multiple layers. For example, contact barrier layer 244 may include a first sub-layer that includes titanium and a second sub-layer that includes titanium nitride. In another example, contact barrier layer 244 may include a first sub-layer that includes tantalum and a second sub-layer that includes tantalum nitride. Contact bulk layer 246 includes tungsten, ruthenium, cobalt, copper, aluminum, iridium, palladium, platinum, nickel, low resistivity metal constituent, alloys thereof, or combinations thereof. In the depicted embodiment, contact bulk layer 246 includes tungsten, ruthenium, and/or cobalt. In some embodiments, source/drain contact 240 does not include contact barrier layer 244 (i.e., source/drain contact 240 is a barrier-free contact), such that contact bulk layer 246 physically contacts contact isolation layer 242 and/or epitaxial source/drain feature 228 (in particular, second epitaxial layer 224). In some embodiments, source/drain contact 240 is partially barrier-free, where contact barrier layer 244 is disposed between contact isolation layer 242 and a portion of contact bulk layer 246. In some embodiments, contact bulk layer 246 includes multiple layers.

The present disclosure provides for many different embodiments. An exemplary method includes performing a first etching process to form a source/drain recess adjacent to a semiconductor layer stack that is disposed over a mesa structure of a substrate. The first etching process is tuned to control a profile of a bottom portion of the source/drain recess. The method further includes performing a deposition process to form an inner spacer layer in the source/drain recess. The inner spacer layer is disposed on the semiconductor layer stack and the mesa structure of the substrate and the inner spacer layer fills the bottom portion of the source/drain recess. The method further includes performing a second etching process to remove a portion of the inner spacer layer and form an inner spacer on the mesa structure of the substrate. The method further includes epitaxially growing a source/drain feature from the semiconductor layer stack such that the source/drain feature fills the source/drain recess and a void is formed between the inner spacer and the source/drain feature.

An exemplary device includes a semiconductor layer stack disposed over a mesa structure of a substrate. The device further includes a metal gate disposed over the semiconductor layer stack and an inner spacer disposed on the mesa structure of the substrate. The device further includes a first epitaxial source/drain feature and a second epitaxial source/drain feature where the semiconductor layer stack is disposed between the first epitaxial source/drain feature and the second epitaxial source/drain feature. The device further includes a void disposed between the inner spacer and the first epitaxial source/drain feature.

An exemplary device includes a fin portion of a substrate with a semiconductor channel layer disposed over the fin portion. The device further includes a metal gate that surrounds the semiconductor channel layer where the metal gate is disposed between the semiconductor channel layer and the fin portion of the substrate. The device further includes a dielectric layer disposed on the fin portion and the metal gate. The device further includes a source/drain feature disposed adjacent the semiconductor channel layer and an air space disposed between the dielectric layer and the source/drain feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a semiconductor layer stack disposed over a mesa structure of a substrate;
a metal gate disposed over the semiconductor layer stack;
an inner spacer disposed on the mesa structure of the substrate;
a first epitaxial source/drain feature and a second epitaxial source/drain feature, wherein the semiconductor layer stack is disposed between the first epitaxial source/drain feature and the second epitaxial source/drain feature and each of the first epitaxial source/drain feature and the second epitaxial source/drain feature includes a first epitaxial layer interfacing the semiconductor layer stack and a second epitaxial layer spaced apart from the semiconductor layer stack by the first epitaxial layer;
a void disposed between the inner spacer and the first epitaxial source/drain feature; and
a contact isolation layer disposed over the first epitaxial source/drain feature to interface the first epitaxial layer of the first epitaxial source/drain feature.

2. The semiconductor device of claim 1, wherein the first epitaxial source/drain feature does not directly contact the mesa structure.

3. The semiconductor device of claim 1, wherein:
the semiconductor layer stack includes a first semiconductor layer disposed over a second semiconductor layer;
the metal gate is disposed between the first semiconductor layer and the second semiconductor layer and between the second semiconductor layer and the mesa structure;
the inner spacer is a first inner spacer disposed between the second semiconductor layer and the mesa structure;
the semiconductor device further includes a second inner spacer disposed between the first semiconductor layer and the second semiconductor layer, wherein a first thickness of the first inner spacer is greater than a second thickness of the second inner spacer; and
the first epitaxial source/drain feature is disposed along the first semiconductor layer, the second semiconductor layer, the second inner spacer, and the first inner spacer.

4. The semiconductor device of claim 1, wherein the void extends above a top surface of the mesa structure.

5. The semiconductor device of claim 1, wherein the void is a first void and the semiconductor device further comprises a second void disposed within the second epitaxial source/drain feature.

6. The semiconductor device of claim 1, wherein the void is bounded by the inner spacer and the first epitaxial source/drain feature.

7. The semiconductor device of claim 1, wherein a top portion of the void has a greater width than a bottom portion of the void.

8. A semiconductor device, comprising:
a fin portion of a substrate;
a semiconductor channel layer disposed over the fin portion;
a metal gate that surrounds the semiconductor channel layer, wherein the metal gate is disposed between the semiconductor channel layer and the fin portion of the substrate;
a dielectric layer disposed on the fin portion and the metal gate;
a source/drain feature disposed adjacent the semiconductor channel layer, wherein the source/drain feature comprises a first epitaxial layer in contact with the semiconductor channel layer and a second epitaxial layer spaced apart from the semiconductor channel layer by the first epitaxial layer;
an air space disposed between the dielectric layer and the source/drain feature;
a contact isolation layer disposed over the source/drain feature to contact the first epitaxial layer; and
a contact layer extending through the contact isolation layer to interface with the source/drain feature.

9. The semiconductor device of claim 8, wherein the air space has a middle portion having a first thickness and end portions having a second thickness, wherein the first thickness is less than the second thickness.

10. The semiconductor device of claim 9, wherein a first portion of the dielectric layer disposed between the metal gate and the end portions of the air space have a third thickness, a second portion of the dielectric layer disposed between the fin portion and the middle portion of the air space has a fourth thickness, and the fourth thickness is greater than the third thickness.

11. The semiconductor device of claim 8, wherein the air space extends from a top surface of the dielectric layer to a bottom surface of the source/drain feature.

12. The semiconductor device of claim 8, wherein the air space extends from a top surface of the dielectric layer to above a top surface of the fin portion.

13. The semiconductor device of claim 8, wherein the fin portion is a first fin portion and the semiconductor device further comprises a second fin portion adjacent the first fin portion, wherein the first fin portion and the second fin portion form a V-shaped recess, wherein the dielectric layer covers the V-shaped recess.

14. A semiconductor structure, comprising:
a mesa arising from a substrate;
a first plurality of channel layers disposed over the mesa;
a second plurality of channel layers disposed over the mesa;
a source/drain feature extending between the first plurality of channel layers and the second plurality of channel layers, wherein the source/drain feature comprises a first epitaxial layer in contact with the first plurality of channel layers and the second plurality of channel layers and a second epitaxial layer spaced apart from the first plurality of channel layers and the second plurality of channel layers by the first epitaxial layer;
a contact isolation layer disposed over the source/drain feature to contact with the first epitaxial layer; and
a void disposed between a bottom surface of the source/drain feature and the mesa,
wherein the void is spaced apart from the mesa by a bottom inner spacer.

15. The semiconductor structure of claim 14, wherein the void extends into the mesa.

16. The semiconductor structure of claim 14, further comprising:
a gate structure wrapping around each of the first plurality of channel layers.

17. The semiconductor structure of claim 16, wherein the gate structure is spaced apart from the source/drain feature by a plurality of inner spacer features.

18. The semiconductor structure of claim 17, wherein the plurality of inner spacer features interleave the first plurality of channel layers.

19. The semiconductor structure of claim 17, wherein the plurality of inner spacer features and the bottom inner spacer share a same composition.

20. The semiconductor structure of claim 17, wherein the plurality of inner spacer features and the bottom inner spacer comprise silicon oxide, silicon nitride, silicon oxynitride, silicon carbide, or silicon oxycarbonitride.

* * * * *